United States Patent
Tziviskos et al.

(10) Patent No.: US 10,622,756 B1
(45) Date of Patent: Apr. 14, 2020

(54) GASKETS FOR SEALING SPRING-LOADED CONTACTS

(71) Applicant: Apple Inc., Cupertino, CA (US)

(72) Inventors: George Tziviskos, San Jose, CA (US); Vijay Karthik Koneru, Los Angeles, CA (US); Christopher Wiita, Los Angeles, CA (US); Duy P. Le, Los Angeles, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/373,539

(22) Filed: Apr. 2, 2019

Related U.S. Application Data

(60) Provisional application No. 62/735,804, filed on Sep. 24, 2018.

(51) Int. Cl.
| | |
|---|---|
| *H01R 13/52* | (2006.01) |
| *H05K 5/02* | (2006.01) |
| *H01F 7/02* | (2006.01) |
| *H01R 13/17* | (2006.01) |
| *H01R 13/24* | (2006.01) |
| *H01R 13/62* | (2006.01) |

(52) U.S. Cl.
CPC ............. *H01R 13/521* (2013.01); *H01F 7/02* (2013.01); *H01R 13/17* (2013.01); *H05K 5/0247* (2013.01); *H01R 13/2421* (2013.01); *H01R 13/6205* (2013.01)

(58) Field of Classification Search
CPC ............ H01R 13/2421; H01R 13/2428; H01R 13/521; H01R 13/6205
See application file for complete search history.

(56) References Cited

U.S. PATENT DOCUMENTS

| | | | | |
|---|---|---|---|---|
| 4,146,286 A | * | 3/1979 | Jones ..................... | H01R 13/22 439/281 |
| 4,891,013 A | * | 1/1990 | Komaki ............... | G06K 7/0021 200/512 |
| 4,894,495 A | * | 1/1990 | Toda ....................... | A61B 1/04 200/51.12 |
| 5,052,484 A | * | 10/1991 | Gesta .................... | H01R 13/24 166/55 |
| 5,562,467 A | * | 10/1996 | Davis, II ................ | H01R 13/24 200/51.09 |
| 8,460,008 B1 | * | 6/2013 | Lin ..................... | H01R 13/6205 439/39 |
| 8,469,731 B2 | * | 6/2013 | Gloaguen ............ | H01R 13/187 439/181 |
| 8,506,314 B2 | * | 8/2013 | Gramsamer ....... | H01R 13/2421 439/289 |

(Continued)

OTHER PUBLICATIONS

Yokowo Spring Loaded Connector Waterproof System, "Reflow Type" Product Image Sheet, [online], Yokowo America Corporation, [retrieved on Nov. 30, 2018], retrieved from the Internet: <URL: http://www.yokowoconnector.com/technology/content_02/index2.html>, 2 pages.

(Continued)

*Primary Examiner* — Ross N Gushi
(74) *Attorney, Agent, or Firm* — Kilpatrick Townsend & Stockton LLP

(57) ABSTRACT

Structures and methods for connector assemblies and their spring-loaded contacts that can resist corrosion, consume a minimal volume in an electronic device, and are readily manufactured.

20 Claims, 18 Drawing Sheets

(56) References Cited

U.S. PATENT DOCUMENTS

| | | | | |
|---|---|---|---|---|
| 9,077,105 B2 * | 7/2015 | Kim | | H01R 13/6205 |
| 9,088,098 B2 * | 7/2015 | Hwang | | H01R 13/6205 |
| 9,130,291 B2 * | 9/2015 | Poh | | H01R 13/6205 |
| 9,160,102 B1 * | 10/2015 | Morgan | | H01R 11/30 |
| 9,391,390 B2 * | 7/2016 | Endo | | H01R 13/2421 |
| 9,431,182 B2 * | 8/2016 | Kim | | H01H 1/58 |
| 9,431,759 B2 * | 8/2016 | Hirano | | H01R 13/58 |
| 9,450,362 B2 * | 9/2016 | Wang | | H01R 31/06 |
| 9,847,609 B2 * | 12/2017 | Planard-Luong | | H01R 13/521 |
| 9,876,307 B2 * | 1/2018 | Wagman | | H01R 12/53 |
| 9,899,757 B2 * | 2/2018 | Do | | H01R 13/42 |
| 10,050,378 B2 * | 8/2018 | Szeto | | H01R 11/30 |
| 10,177,490 B2 * | 1/2019 | Michelmann | | H01R 13/6205 |
| 10,303,213 B2 * | 5/2019 | Shaw | | H01F 7/0263 |
| 10,317,430 B2 * | 6/2019 | Nagata | | G01R 1/0466 |
| 10,433,584 B2 * | 10/2019 | Nettenstrom | | B65D 43/163 |
| 10,446,948 B2 * | 10/2019 | Szeto | | G06F 1/1683 |
| 2012/0032765 A1 * | 2/2012 | Bilbrey | | H01R 13/6205 335/306 |
| 2012/0295451 A1 * | 11/2012 | Hyun-Jun | | H01R 13/6205 439/39 |
| 2015/0280370 A1 * | 10/2015 | Huang | | H01R 24/46 439/188 |
| 2019/0067859 A1 * | 2/2019 | Sugiura | | H01R 11/01 |
| 2019/0243420 A1 * | 8/2019 | Shaw | | G06F 1/1632 |

OTHER PUBLICATIONS

Yokowo Spring Loaded Connector Waterproof System, "Built in Type" Product Image Sheet, [online], Yokowo America Corporation, [retrieved on Nov. 30, 2018], retrieved from the Internet: <URL: http://www.yokowoconnector.com/technology/content_02/index3.html, 1 page.

* cited by examiner

GASKETS FOR SEALING SPRING-LOADED CONTACTS

CROSS REFERENCE TO RELATED APPLICATIONS

The present application claims the benefit of U.S. provisional application No. 62/735,804, filed Sep. 24, 2018.

BACKGROUND

Power and data can be provided from one electronic device to another over contacts on the electronic devices. In some electronic systems, contacts of two electronic devices can come into direct contact with each other without the need for intervening cables. For example, spring-loaded contacts on a first electronic device can form physical and electrical connections with contacts on a surface of a second electronic device. The spring-loaded contacts of the first electronic device can be housed in a connector assembly, which can be located in a device enclosure that at least partially houses the first electronic device.

These contacts and connector assemblies can be exposed to liquids and fluids that can cause them to corrode. For example, a user can purposely or inadvertently submerge the first or second electronic device in a liquid. A user can spill a liquid or perspire on contacts of either or both of the first or second electronic devices. This moisture can cause one or more contacts to corrode, particularly where a voltage is present on the one or more contacts. This corrosion can impair the operation of an electronic device and in severe cases can render the electronic device inoperable. Even where operation is not fully impaired, device operation can become inconsistent or unreliable. Also, this corrosion can mar the appearance of the contacts.

Electronic devices using these connector assemblies can be small. As a result, these connector assemblies can consume a large amount of space inside the electronic device. Accordingly, it can be desirable that these connector assemblies be small.

Also, some of these electronic devices become tremendously popular. As a result, connector assemblies on electronic devices can be sold in very large quantities. Therefore, it can be desirable that these connector assemblies be readily manufactured such that customer demand for them can be met.

Thus, what is needed are structures and methods for connector assemblies that can resist corrosion, consume a minimal volume in an electronic device, and are readily manufactured.

SUMMARY

Accordingly, embodiments of the present invention can provide structures and methods for connector assemblies that can resist corrosion, consume a minimal volume in an electronic device, and are readily manufactured.

An illustrative embodiment of the present invention can provide connector assemblies that can provide movable contacts at a surface of an electronic device. The connector assemblies can include a nonconductive connector assembly housing supporting one, two, three, or more movable contacts. Each movable contact can be a spring-loaded contact. The spring-loaded contacts can have contacting portions that emerge from corresponding openings in the connector assembly housing.

The connector assembly can be located in a device enclosure, where the device enclosure can fully, substantially, or at least partially house the connector assembly and other electronic components for the electronic device. The connector assembly can include the connector assembly housing to support the spring-loaded contacts. The spring-loaded contacts can include a plunger located in a barrel, where the plunger can move in the barrel. The barrel can have a front opening that is narrowed to limit the travel of the plunger, which can have a widened base portion and a narrow contacting portion extending from the barrel. This can prevent the plunger from exiting the barrel. The barrel can include barbs along its side to help to secure the barrel in the connector assembly housing. A spring can be located in the barrel and between a backside of the plunger and a back of the barrel to bias the plunger out of the barrel. An inner gasket can be located between the connector assembly housing and the spring-loaded contact. This inner gasket can help to prevent the ingress of liquid, moisture, debris, or other substances into the connector assembly itself and the electronic device housing the connector assembly.

In these and other embodiments of the present invention, an inner gasket can be located between the connector assembly housing and the plunger of each spring-loaded contact. For example, the connector assembly housing can include a top surface. The top surface can be positioned around the plunger of a spring-loaded contact, where the plunger passes through an opening in the connector assembly housing. The inner gasket can have an outer ring that can be attached to the top surface of the connector assembly housing. The inner gasket can further have an inner ring that can fit around a circumference of the contacting portion of the plunger. The inner gasket can be formed of a pliable material such that the plunger can be depressed when a connection is formed with a corresponding contact on a second electronic device and extended when the connection is broken.

The contact assembly can be located in a device enclosure such that the outer ring of the inner gasket is between the top surface of the connector assembly housing and a bottom or inside surface of the device enclosure. This can help to secure the inner gasket in place, thereby improving the resulting seal. The device enclosure can include openings, recesses, and other features to allow access to the contacting portions of the spring-loaded contacts by contacts of a second electronic device, such as an accessory device. In these and other embodiments of the present invention, an interference rib can be formed on the top surface of the connector assembly housing and positioned under the outside ring of the inner gasket. This can help to seal the outside ring of the inner gasket to the connector assembly housing. Adhesives, such as pressure-sensitive adhesives, temperature-sensitive adhesives, or heat-activated adhesives can be used to attach the inner gaskets to any or all of a connector assembly housing, a device enclosure, or a plunger of the spring-loaded contact.

These inner gaskets can help to protect the ingress path from an outside of the device enclosure to the inside of the electronic device. For example, it can protect the ingress path from an outside of the device enclosure, though a spring-loaded contact between the plunger and barrel, and into the electronic device. This can help to reduce an amount of liquid or other substances that can enter and corrode the inside of the spring-loaded contact and electronic device. It can also protect the ingress path from an outside of the device enclosure, between the plunger and connector assembly housing, and into the electronic device. This can help to reduce an amount of liquid or other substances that can enter and corrode the outside of the spring-loaded contact and electronic device.

In these and other embodiments of the present invention, the inner gasket can further include a bellows between the outer ring and the inner ring. These bellows can form a recessed portion. Liquid or other material can flow away from the plunger and instead gather at this recessed portion. This can help to prevent or reduce the corrosion of the plunger. The liquid or other material can evaporate while it is located in the recessed portion of the bellows thereby reducing the corrosion of the plunger.

In these and other embodiments of the present invention, the inner gasket can be made of various materials, such as silicone, thermoplastic polyurethane (TPU), thermoplastic elastomer (TPE), or other elastomer or other material or combination of materials. The material can be a low compression set material that is flexible and soft. It can have a Shore durometer of 20A, 30A, 45A, or it can have another shore durometer.

In these and other embodiments of the present invention, an accessory device can include contacts that mate with the spring-loaded contacts of the electronic device. The accessory device contacts can be located on a surface of the accessory device. Moisture or other corrosion inducing substances can bridge two or more of the contacts of the accessory device thereby leading to damage of the accessory device. For example, moisture, such as sweat, can bridge a power and a ground contact on the accessory device. When the accessory device is charged, current can flow into the accessory device contacts in the presence of this moisture. This can cause the plating on the contacts to ionize and corrode. Accordingly, these and other embodiments of the present invention can provide an outer gasket that can provide a seal between contacts on the accessory device.

In these and other embodiments of the present invention, the outer gasket can be formed using a two-shot molding process. The first shot can form a rigid base, while the second shot can form a pliable seal over at least a portion of the rigid base. The outer gasket can be located between the inner gaskets and the electronic device housing. The rigid base of the outer gasket can provide support for the inner gaskets and can include openings for plungers of the spring-loaded contacts. The pliable seal of the outer gasket can form a seal between the rigid base of the outer gasket and an electronic device housing to prevent leakage into the electronic device. The pliable seal of the outer gasket can also form seals around contacts of the accessory device and around spring-loaded contacts of the electronic device. The pliable seal can include individual rings, each around an opening for a plunger of a spring-loaded contact of the electronic device and each around a circumference or perimeter of an accessory device contact.

The pliable outer seal can isolate contacts at a surface of the accessory device from each other to prevent moisture bridging. Accordingly, in these and other embodiments of the present invention, various structures and techniques can be used to improve this seal and to further isolate and protect accessory device contacts of the accessory device.

For example, the electronic device can be a docking station or charging case designed to hold and charge one, two, three, or more than three accessory devices. The charging case can have a lid that can close when the accessory devices are in place. Retention features can be included on an inside surface of the lid. These retention features can provide a force on the accessory devices pushing them into the pliable seals of the outer gaskets on the electronic device. This force can act to improve the seal and therefore the isolation between contacts of the accessory devices.

In these and other embodiments of the present invention, the retention features can be formed as part of the electronic device lid or other housing portion. The retention features can be formed separately from and attached to the electronic device lid or other housing portion. The retention features can be placed under a liner or other layer that holds them in place against the electronic device lid or other housing portion. There can be one or more retention features for each accessory device. Either or both of the retention features or electronic device lid can be pliable. The retention features can be substantially hollow pliable structures. The retention features can include one or more ribs or other support structures to assist them in holding their shape.

In these and other embodiments of the present invention, magnets can be used to improve this seal and to further isolate contacts of the accessory device. To save space in an accessory device, each accessory device can include a limited number of magnets, such as one or two magnets. A corresponding array of magnets can be used in the electronic device to hold the accessory device in place to improve the seal provided by the pliable seal of the outer gasket. For example, an accessory device magnet having a north pole and a south pole can be placed laterally along a side of an accessory device. Three magnets can be arranged in the electronic device. A south pole of a first magnet can be placed proximate to the north pole of the accessory device magnet. A second magnet can be placed such that its south pole is proximate to the north pole of the accessory device magnet and its north pole is proximate to the south pole of the accessory device magnet. A third magnet can be placed such that its north pole is proximate to the south pole of the accessory device magnet. Additional magnets can be used to supplement these magnets. For example, a second accessory device magnet can attract a fourth electronic device magnet, where these additional magnets are arranged to provide a magnetic direction in a direction that is orthogonal to the magnetic attraction provided by the above magnets to further secure the accessory device in place in the electronic device. Some or all of these magnets can be rare earth magnets or other types of magnets.

In these and other embodiments of the present invention, another gasket or O-ring can be located between the barrel of a spring-loaded contact and the connector assembly housing. Also, other structures, such as barbs on the barrels of the spring-loaded contacts, can be included to protect these leakage paths and help to reduce the amount of ingress of liquids or other substances into the spring-loaded contacts and electronic device.

In these and other embodiments of the present invention, the connector assemblies can be kept small by only using two spring-loaded contacts. These contacts can be used to convey power and ground. They can also be used to convey data, or data can be wirelessly transmitted and received by the electronic device.

Embodiments of the present invention can provide connector assemblies that can be located in various types of devices, such as portable computing devices, tablet computers, desktop computers, laptops, all-in-one computers, wearable computing devices, cell phones, docking stations, smart phones, media phones, storage devices, keyboards, covers, charging cases, portable media players, navigation systems, monitors, power supplies, adapters, audio devices and equipment, remote control devices, chargers, and other devices. These connector assemblies can provide pathways for signals and power compliant with various standards such as one of the Universal Serial Bus (USB) standards including USB Type-C, High-Definition Multimedia Interface® (HDMI), Digital Visual Interface (DVI), Ethernet, DisplayPort, Thunderbolt™, Lightning™, Joint Test Action Group (JTAG), test-access-port (TAP), Directed Automated Random Testing (DART), universal asynchronous receiver/transmitters (UARTs), clock signals, power signals, and other types of standard, non-standard, and proprietary interfaces and combinations thereof that have been developed, are being developed, or will be developed in the future. In one example, the connector assemblies can be used to convey a data signal, a power supply, and ground. In various embodiments of the present invention, the data signal can be unidirectional or bidirectional and the power supply can be unidirectional or bidirectional. In these and other embodiments of the present invention, the connector assemblies can be used to convey power and ground, while data is transmitted wirelessly.

Various embodiments of the present invention can incorporate one or more of these and the other features described herein. A better understanding of the nature and advantages of the present invention can be gained by reference to the following detailed description and the accompanying drawings.

DESCRIPTION OF EXEMPLARY EMBODIMENTS

Figure 1:
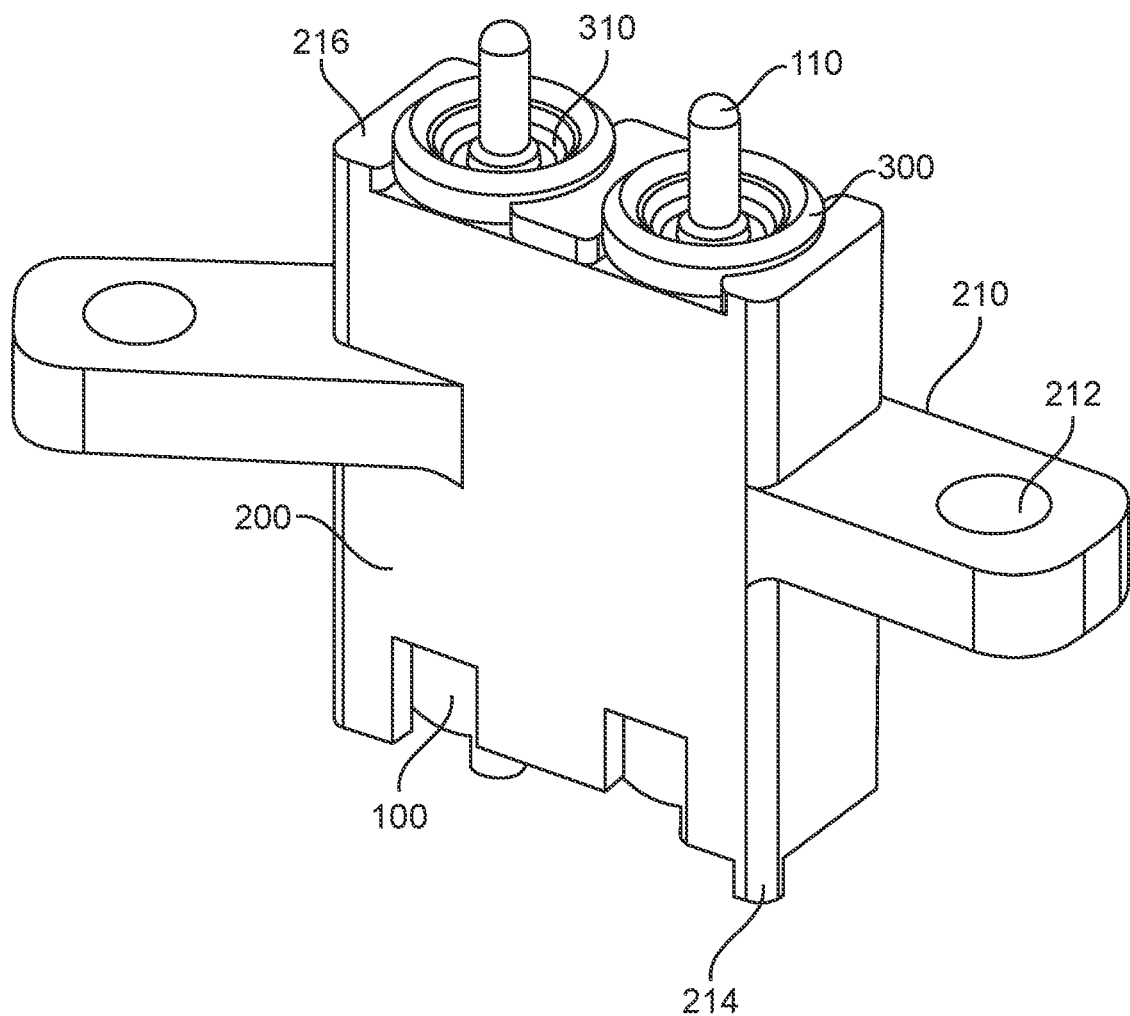
FIG. 1 illustrates a connector assembly according to an embodiment of the present invention.

FIG. 1 illustrates a connector assembly according to an embodiment of the present invention. This figure, as with the other included figures, is shown for illustrative purposes and does not limit either the possible embodiments of the present invention or the claims.

In this example, connector assembly housing 200 can support two spring-loaded contacts 100, though one, three, or more than three spring-loaded contacts 100 can be included in connector assembly housing 200. Connector assembly housing 200 can further include flanges 210 having openings 212 for fasteners (not shown.) Fasteners can be inserted into openings 212 and can secure connector assembly housing 200 to device enclosure 410 (shown in FIG. 9.) Connector assembly housing 200 can further include posts 214. Posts 214 can be inserted into a corresponding opening (not shown) in device enclosure 410 or other housing portion. Connector assembly housing 200 can further include top surface 216. Plungers 110 can extend through top surface 216 of connector assembly housing 200. Inner gasket 300 can extend from around plunger 110 to top surface 216 of connector assembly housing 200 to form a seal. Inner gasket 300 can include bellows or recess 310.

Connector assembly housing 200 can be formed in various ways in various embodiments of the present invention. For example, connector assembly housing 200 can be formed by injection molding, insert molding, 3-D printing, or other method. It can be formed of nylon, plastic, polycarbonate, liquid-crystal polymer (LCP), or other material.

Figure 2:
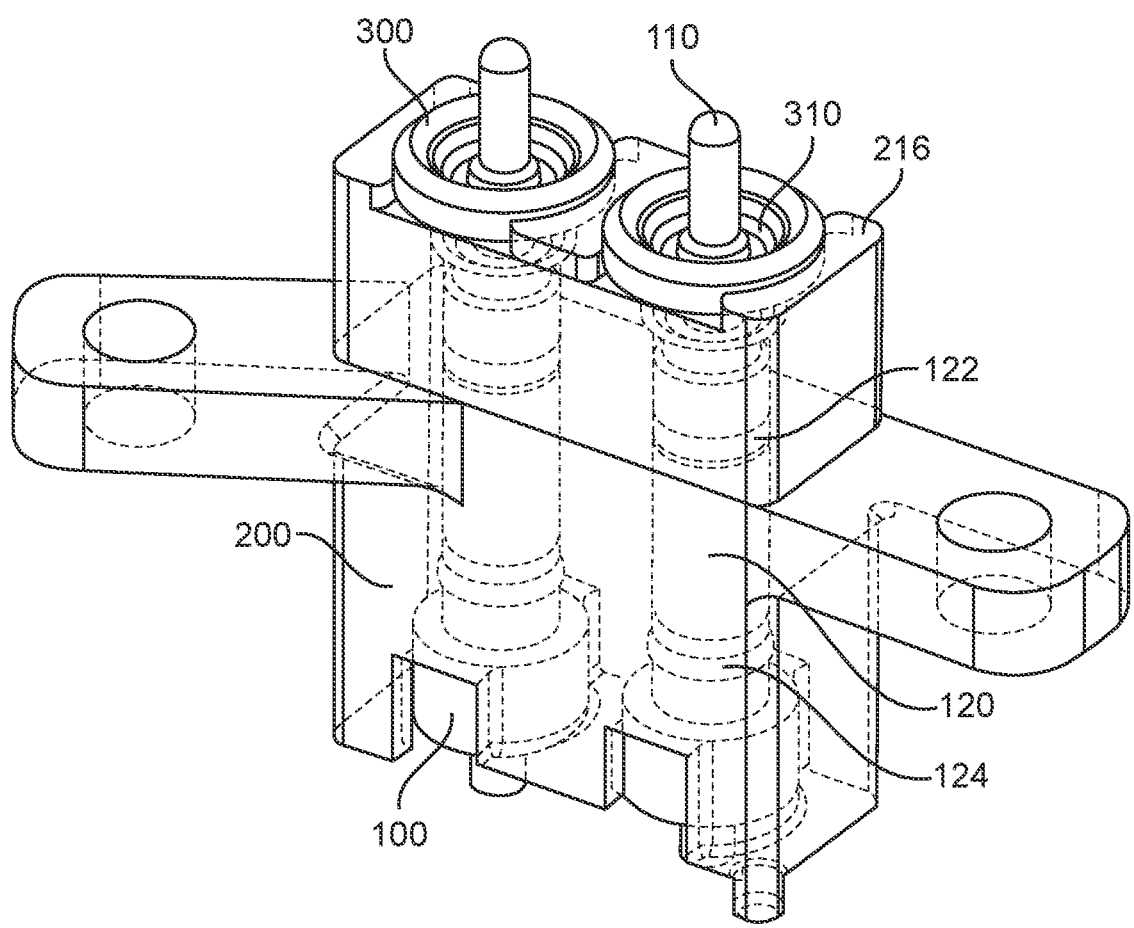
FIG. 2 illustrates the connector assembly of FIG. 1 where the connector assembly housing is transparent.

FIG. 2 illustrates the connector assembly of FIG. 1 where the connector assembly housing is transparent. Again, two spring-loaded contacts 100 can be located in passages in connector assembly housing 200. Spring-loaded contacts 100 can include barb 122 and barb 124 on barrel 120. Barb 122 and barb 124 can help to secure spring-loaded contacts 100 in connector assembly housing 200.

Again, inner gaskets 300 can form a seal between top surface 216 of connector assembly housing 200 and plungers 110 of each spring-loaded contact 100. Inner gaskets 300 can be pliable such that plunger 110 can be depressed and can extend as connections with corresponding contacts are made and broken. Inner gaskets 300 can include a bellows or recess (or reservoir) 310. Liquid or other material can flow away from plunger 110 and gather instead in bellows or recess 310. This can help to prevent or reduce the corrosion of plunger 110. The liquid or other material can evaporate while it is located in the bellows or recess 310 thereby reducing the corrosion of plunger 110.

Figure 12:
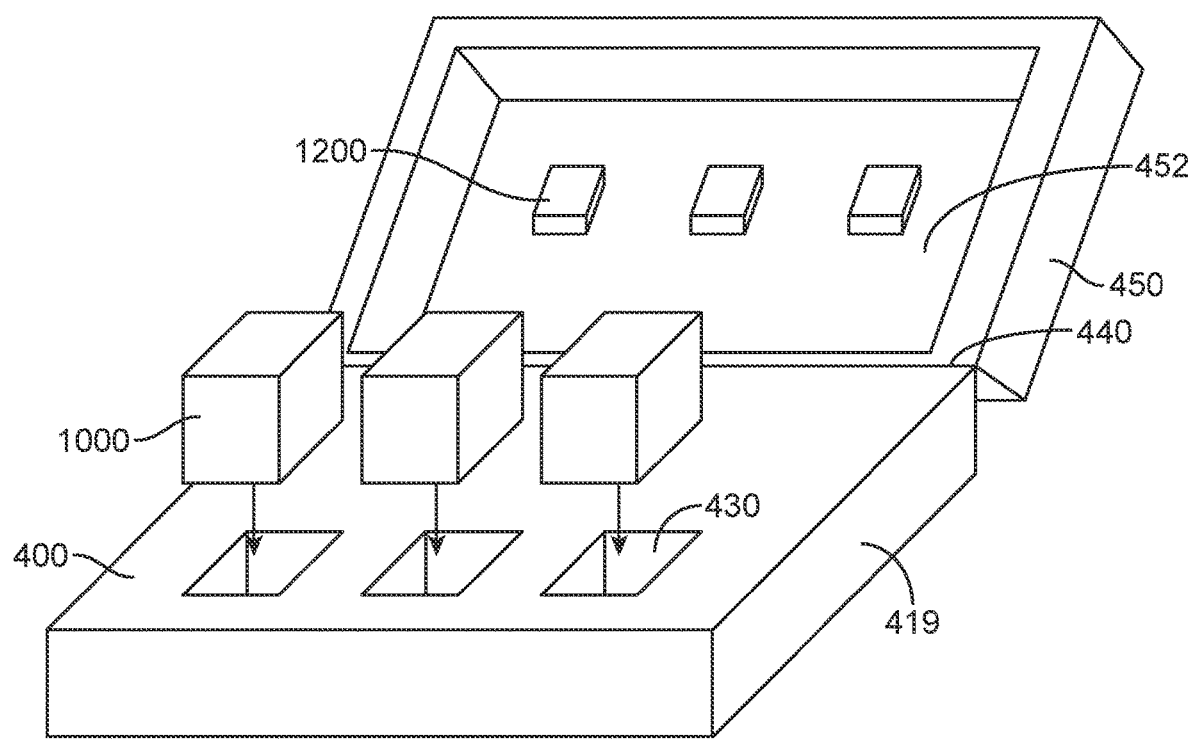
FIG. 12 illustrates an electronic system according to an embodiment of the present invention.

Inner gaskets 300 can help to protect an ingress path from an outside of device enclosure 410 (shown in FIG. 9) and into electronic device 400 (shown in FIG. 12.) For example, they can protect the ingress path from an outside of device enclosure 410, though spring-loaded contact 100 between plunger 110 and barrel 120, and into electronic device 400. This can help to reduce an amount of liquid or other substance that can enter and corrode the inside of spring-loaded contact 100 and electronic device 400. They can also protect the ingress path from an outside of device enclosure 410, between plunger 110 and connector assembly housing 200, and into electronic device 400. This can help to reduce an amount of liquid or other substance that can enter and corrode the outside of spring-loaded contact 100 and electronic device 400.

Figure 3:
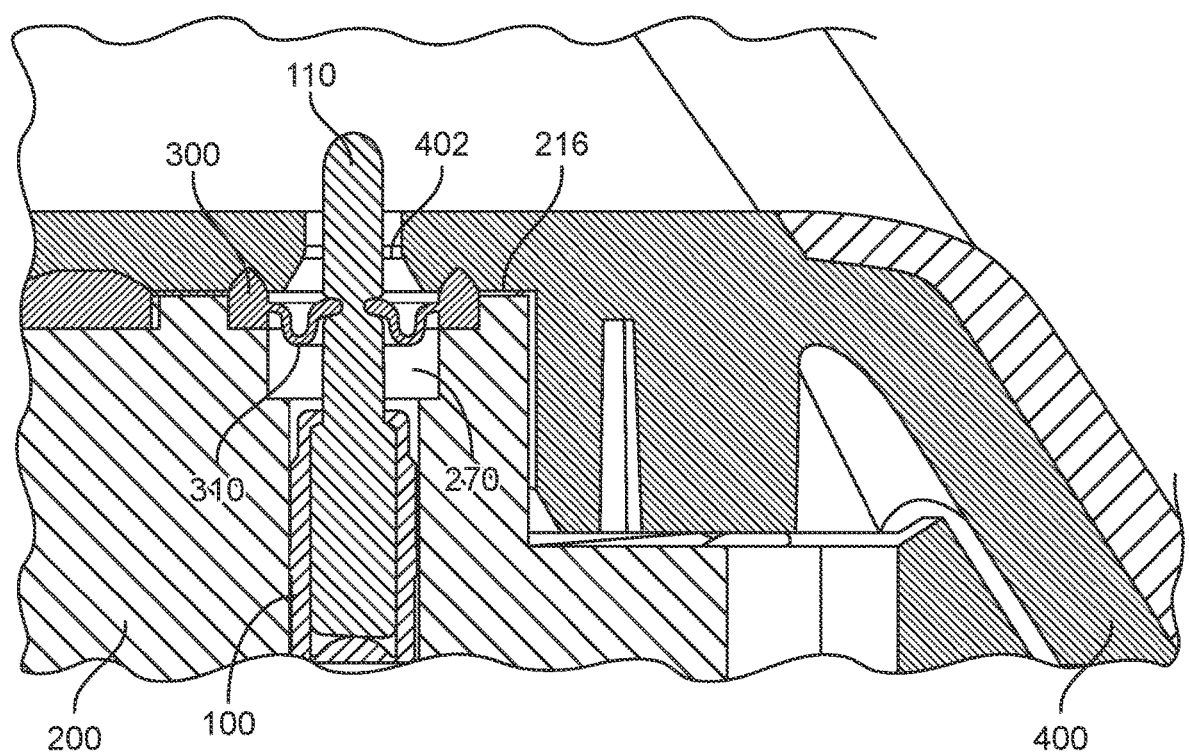
FIG. 3 illustrates the connector assembly housing of FIG. 1 in a device enclosure according to an embodiment of the present invention.

FIG. 3 illustrates the connector assembly housing of FIG. 1 in a device enclosure according to an embodiment of the present invention. As before, spring-loaded contact 100 can be housed in connector assembly housing 200. Plunger 110 of spring-loaded contact 100 can emerge through opening 270 in connector assembly housing 200. Plunger 110 of spring-loaded contact 100 can also emerge through opening 402 in device enclosure 410.

Inner gasket 300 can form a seal between top surface 216 of connector assembly housing 200 and plunger 110. Inner gaskets 300 can also form seals between device enclosure 410 and connector assembly housing 200. Inner gasket 300 can include bellows or recess 310 as before.

Figure 4:
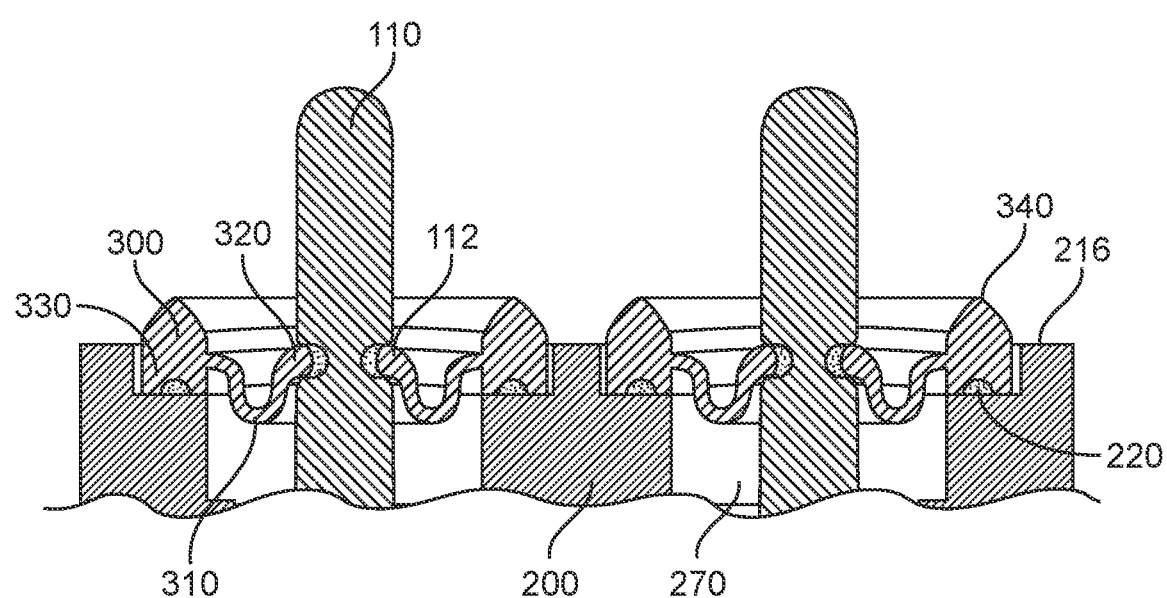
FIG. 4 illustrates a cutaway side view of a portion of a connector assembly according to an embodiment of the present invention.

FIG. 4 illustrates a cutaway side view of a portion of a connector assembly according to an embodiment of the present invention. In this example, plungers 110 can emerge through openings 270 in connector assembly housing 200. Inner gasket 300 can form a seal between connector assembly housing 200 top surface 216 and plunger 110. Inner gaskets 300 can include outer ring 330. Outer ring 330 can be located over interference rib 220 on top surface 216 of connector assembly housing 200. Outer ring 330 can include surface 340, which can mate with device enclosure 410 (shown in FIG. 3.) Inner gaskets 300 can further include inner ring 320, which can fit in circumferential groove 112 around plunger 110. Inner gaskets 300 can further include bellows or recess 310. Again, liquid or other materials can accumulate in recess 310 and thus be kept away from plunger 110. This can help to slow or reduce the corrosion of plunger 110, as well as the remaining portions of spring-loaded contact 100 (shown in more detail in FIG. 5) and electronic device 400 (shown in FIG. 12) housed by device enclosure 410 (shown in FIG. 9.)

Figure 5:
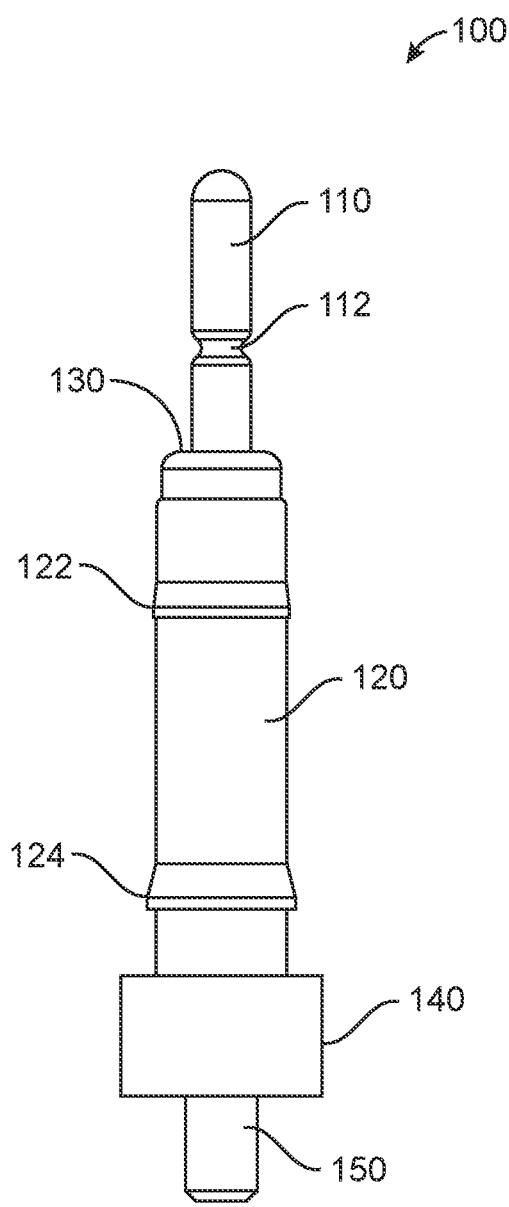
FIG. 5 illustrates a spring-loaded contact according to an abundance of the present invention.

FIG. 5 illustrates a spring-loaded contact according to an embodiment of the present invention. Again, spring-loaded contact 100 can include plunger 110 emerging from front opening 130 in barrel 120. Barb 122 and barb 124 can be located on barrel 120. Barb 122 and barb 124 can help to secure spring-loaded contact 100 in connector assembly housing 200 (as shown in FIG. 2.) Spring-loaded contact 100 can further include a base portion 140 and tail 150. Tail 150 can be soldered or otherwise connected to a wire, a trace on a board (not shown), or other conduit. Base portion 140 can form a rear wall of a cavity inside barrel 120. Barrel 120 can have front opening 130 that is narrowed to limit the travel of plunger 110, which can have a widened base portion 111 (shown in FIG. 11) and a narrow contacting portion 113 (shown in FIG. 11) extending from barrel 120. A spring 102 (shown in FIG. 9) can be located in barrel 120 and can be between plunger 110 and the rear wall. As plunger 110 forms a physical and electrical connection with a corresponding contacts of a corresponding accessory device 1100 (shown in FIG. 10), plunger 110 can be pushed down into barrel 120, thereby compressing spring 102. As the corresponding device is removed, plunger 110 can be driven back out of barrel 120 by spring 102. Again inner gaskets 300 may be flexible or pliable to accommodate these actions.

Figure 6:
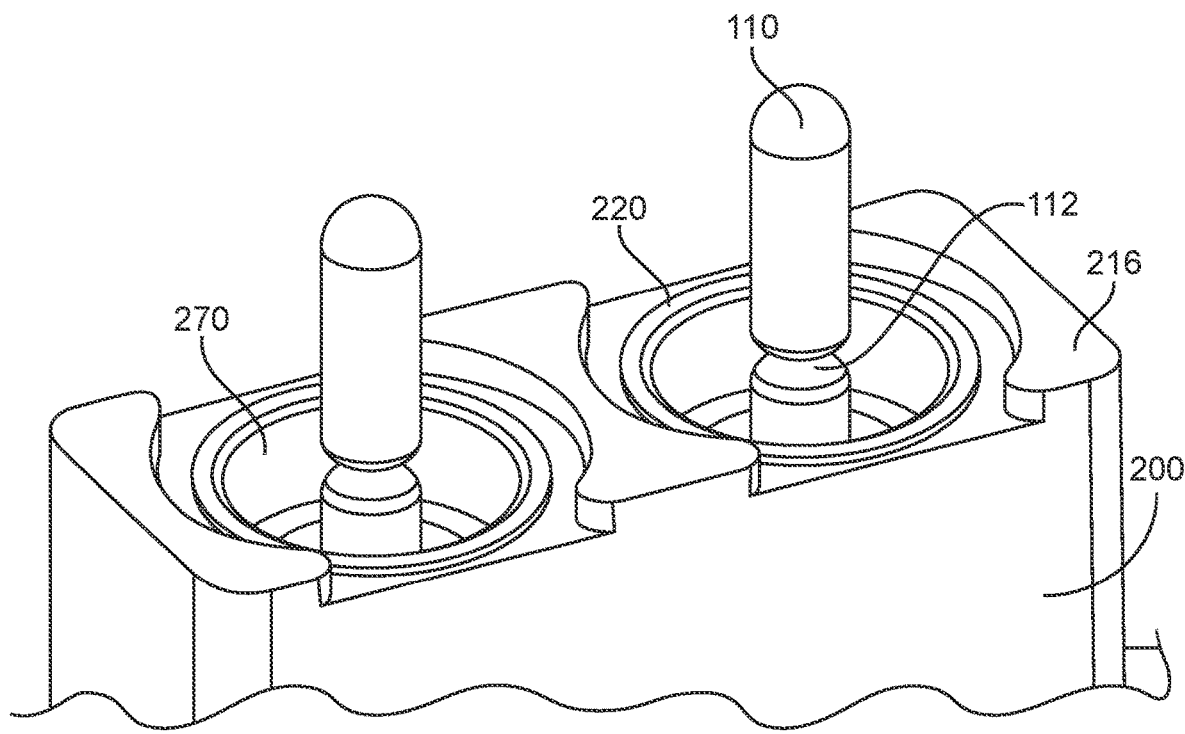
FIG. 6 illustrates a close-up view of a top of a connector assembly housing according to an embodiment of the present invention.
Figure 7:
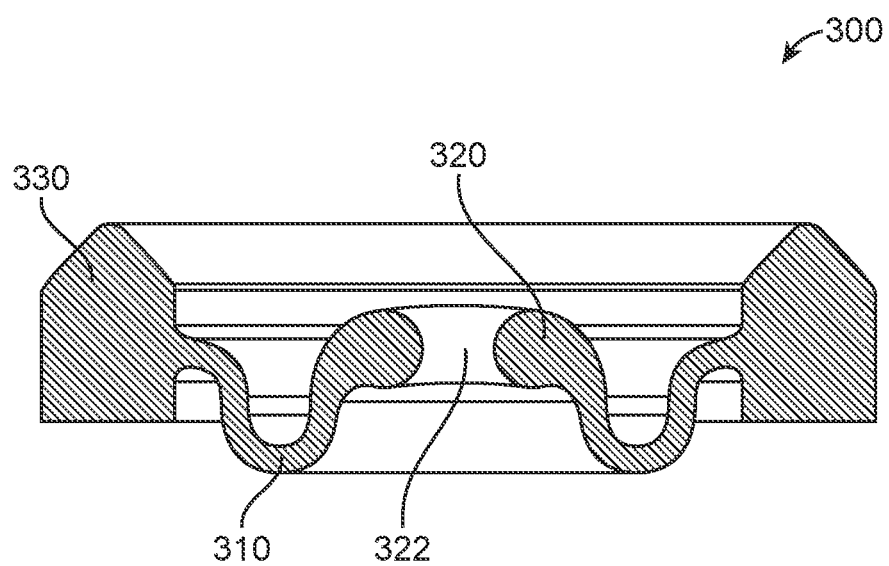
FIG. 7 illustrates a cutaway side view of an inner gasket according to an embodiment of the present invention.

FIG. 6 illustrates a close-up view of a top of a connector assembly housing according to an embodiment of the present invention. Connector assembly housing 200 can include a top surface 216. Plungers 110 of spring-loaded contacts 100 (shown in FIG. 2) can emerge through opening 270. Inner gasket 300 (details of which are shown in FIG. 7) can have an outer ring 330 (shown in FIG. 7) to mate with interference rib 220. Device enclosure 410 (shown in FIG. 3), can compress inner gasket 300 into interference rib 220, thereby improving the seal formed by inner gasket 300. Inner gasket 300 can also be located around circumferential groove 112 of plunger 110.

Adhesives, such as pressure-sensitive adhesives, temperature-sensitive adhesives, or heat-activated adhesives can be used to attach inner gaskets 300 to any or all of a connector assembly housing 200, device enclosure 410, or plunger 110 of spring-loaded contact 100. These adhesives can work together or separately with interference rib 220.

FIG. 7 illustrates a cutaway side view of an inner gasket according to an embodiment of the present invention. Inner gasket 300 can include outer ring 330 and inner ring 320. Inner ring 320 can define an opening 322, which can allow access for plunger 110 (shown in FIG. 6.) Inner ring 320 can fit in circumferential groove 112 (shown in FIG. 6) around plunger 110. Inner gasket 300 can also include bellows or recess 310. Bellows or recess 310 can form a reservoir for liquids or other substances in order to protect plunger 110. Bellows or recess 310 can include a U-shaped portion joining inner ring 320 and outer ring 330. In these and other embodiments of the present invention, bellows and recess 310 can have other shapes.

In these and other embodiments of the present invention, inner gaskets 300 can be made of various materials, such as silicone, thermoplastic polyurethane (TPU), thermoplastic elastomer (TPE), or other elastomer or other material or combination of materials. The material can be a low compression set material that is flexible and soft. It can have a Shore durometer of 20A, 30A, 45A, or it can have another shore durometer. This flexibility can allow plungers 110 on spring-loaded contacts to be depressed and extended while inner gaskets 300 maintain seals between connector assembly housing 200 and plungers 110.

In these and other embodiments of the present invention, an accessory device can include contacts that mate with the spring-loaded contacts of the electronic device. The accessory device contacts can be located on a surface of the accessory device. Moisture or other corrosion inducing substances can bridge two or more of the contacts of the accessory device thereby leading to damage of the accessory device. For example, moisture can bridge a power and a ground contact on the accessory device. When the accessory device is charged, current can flow into the accessory device contacts in the presence of this moisture. This can cause plating on the contacts to ionize and corrode. Accordingly, these and other embodiments of the present invention can provide an outer gasket that can provide a seal between contacts on the accessory device. Examples are shown in the following figures.

Figure 8:
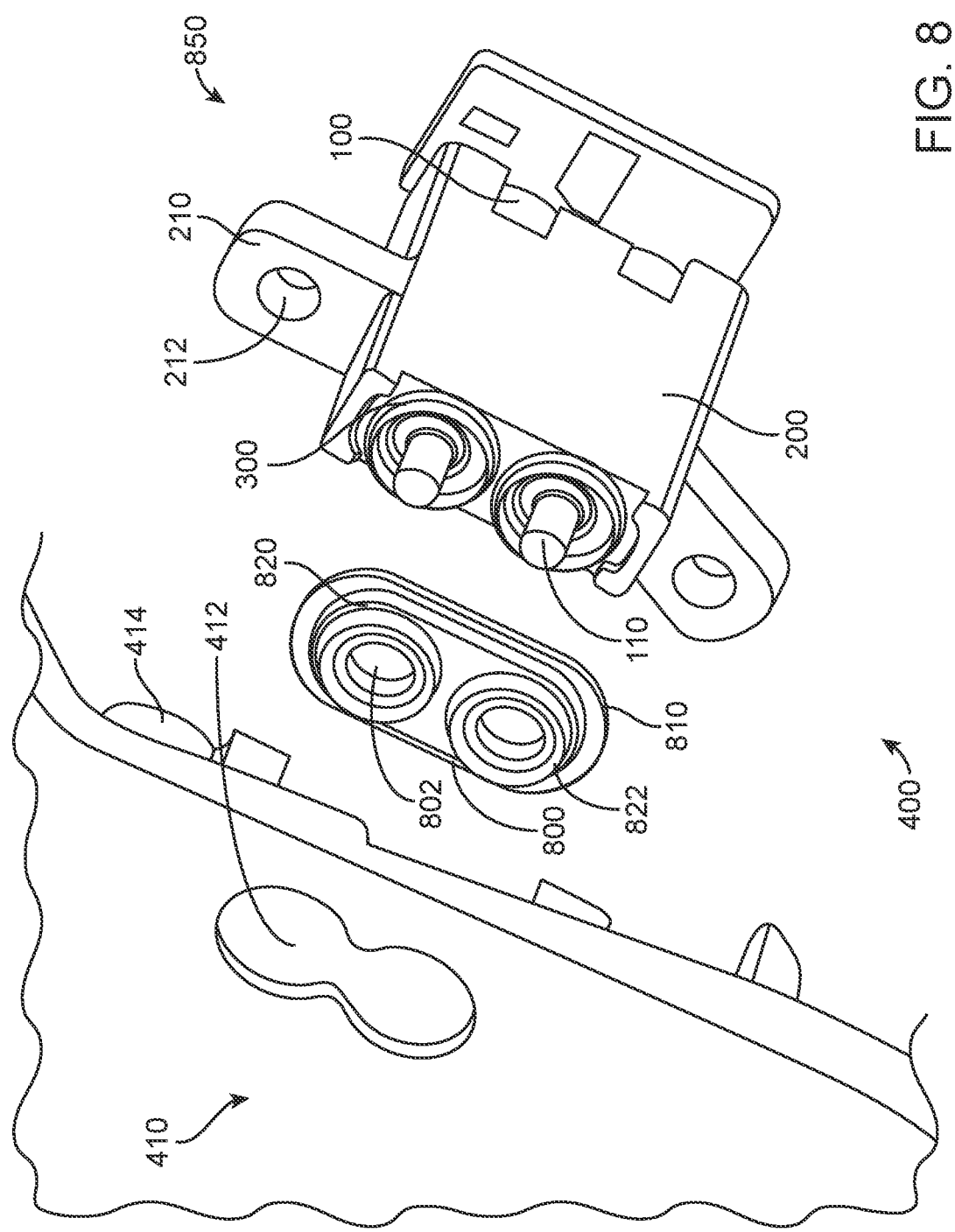
FIG. 8 illustrates an exploded view of a portion of an electronic device according to an embodiment of the present invention.

FIG. 8 illustrates an exploded view of a portion of an electronic device according to an embodiment of the present invention. In this example, outer gasket 800 can be located between inner gaskets 300 of connector assembly 850 and device enclosure 410 of electronic device 400. As before, connector assembly 850 can include spring-loaded contacts 100 housed in connector assembly housing 200. Spring-loaded contacts 100 can include plungers 110, which can physically and electrically connect to accessory device contacts 1020 (shown in FIG. 10) of an accessory device 1000 (shown in FIG. 12) when the accessory device and electronic device 400 are mated. Inner gaskets 300 can be located around plungers 110. Outer gasket 800 can include openings 802 for plungers 110 of spring-loaded contacts 100.

Connector assembly 850 can be attached to device enclosure 410 by fasteners (not shown), such as screws. These fasteners can pass through the openings 212 in flanges 210 of connector assembly housing 200 and into holes in tabs 414 in device enclosure 410.

Accessory device 1000 can include accessory device contacts 1020 (shown in FIG. 10) that can mate with plungers 110 of spring-loaded contacts 100. These accessory device contacts 1020 can be located at a surface of accessory device 1000. Moisture or other corrosive substances can bridge these accessory device contacts 1020. Again, this can lead to corrosion or other damage to accessory device contacts 1020.

Accordingly, embodiments of the present invention can employ outer gaskets 800. Outer gaskets 800 can include a rigid base 810. Rigid base 810 can provide a surface such that inner gaskets 300 can form a seal between rigid base 810 and a top surface 216 of connector assembly housing 200. A pliable seal 820 can be formed on rigid base 810. Pliable seal 820 can include raised portions or rings 822. Rings 822 can engage a surface of a housing for accessory device 1000. Each ring 822 can surround a circumference or perimeter of an accessory device contact 1020 at the surface of accessory device 1000. This can prevent moisture bridging from one accessory device contact 1020 to another, thereby reducing corrosion. This is shown further in the following figures.

Figure 9:
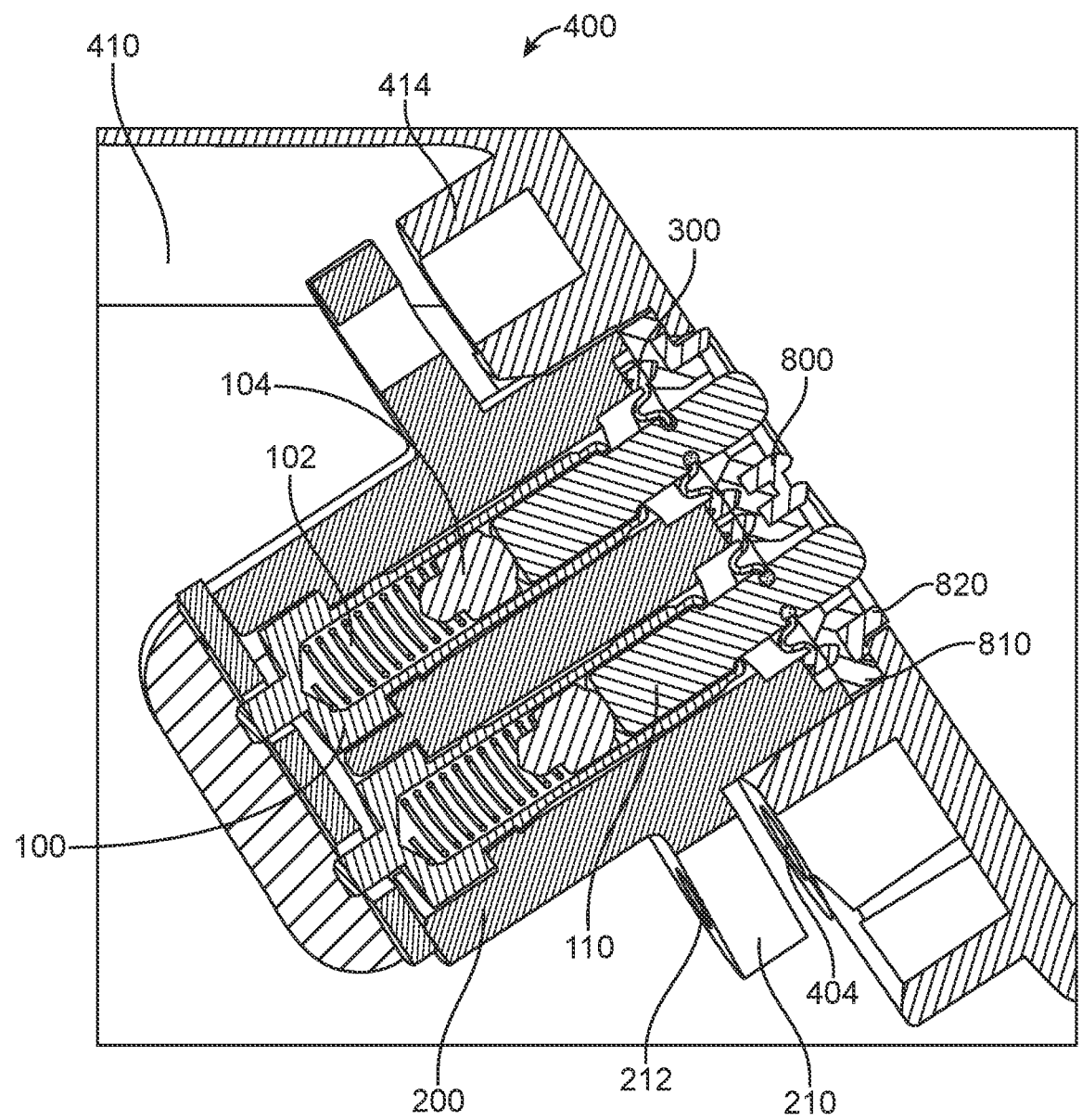
FIG. 9 illustrates a cross-section of a portion of an electronic device according to an embodiment of the present invention.

FIG. 9 illustrates a cross-section of a portion of an electronic device according to an embodiment of the present invention. One or more spring-loaded contacts 100 can be located in connector assembly housing 200. Spring-loaded contacts 100 can include plungers 110, which can be biased by springs 102. Pistons 104 can provide an interface between plungers 110 and springs 102. Further details of spring-loaded contacts 100 can be found in co-pending U.S. patent application Ser. No. 15/722,379, filed Oct. 2, 2017, which is incorporated by reference.

Inner gaskets 300 can provide a seal between plungers 110 and connector assembly housing 200. Outer gaskets 800 can include a rigid base 810. Inner gaskets 300 can further provide seals between rigid base 810 and connector assembly housing 200. Pliable seal 820 of outer gasket 800 can be formed on rigid base 810. Pliable seal 820 can provide a seal around accessory device contacts of an accessory device 1000 (shown in FIG. 10) when the accessory device 1000 is mated with electronic device 400. Pliable seal 820 can also form a seal between connector assembly housing 200 and device enclosure 410. An example is shown in the following figure.

Figure 10:
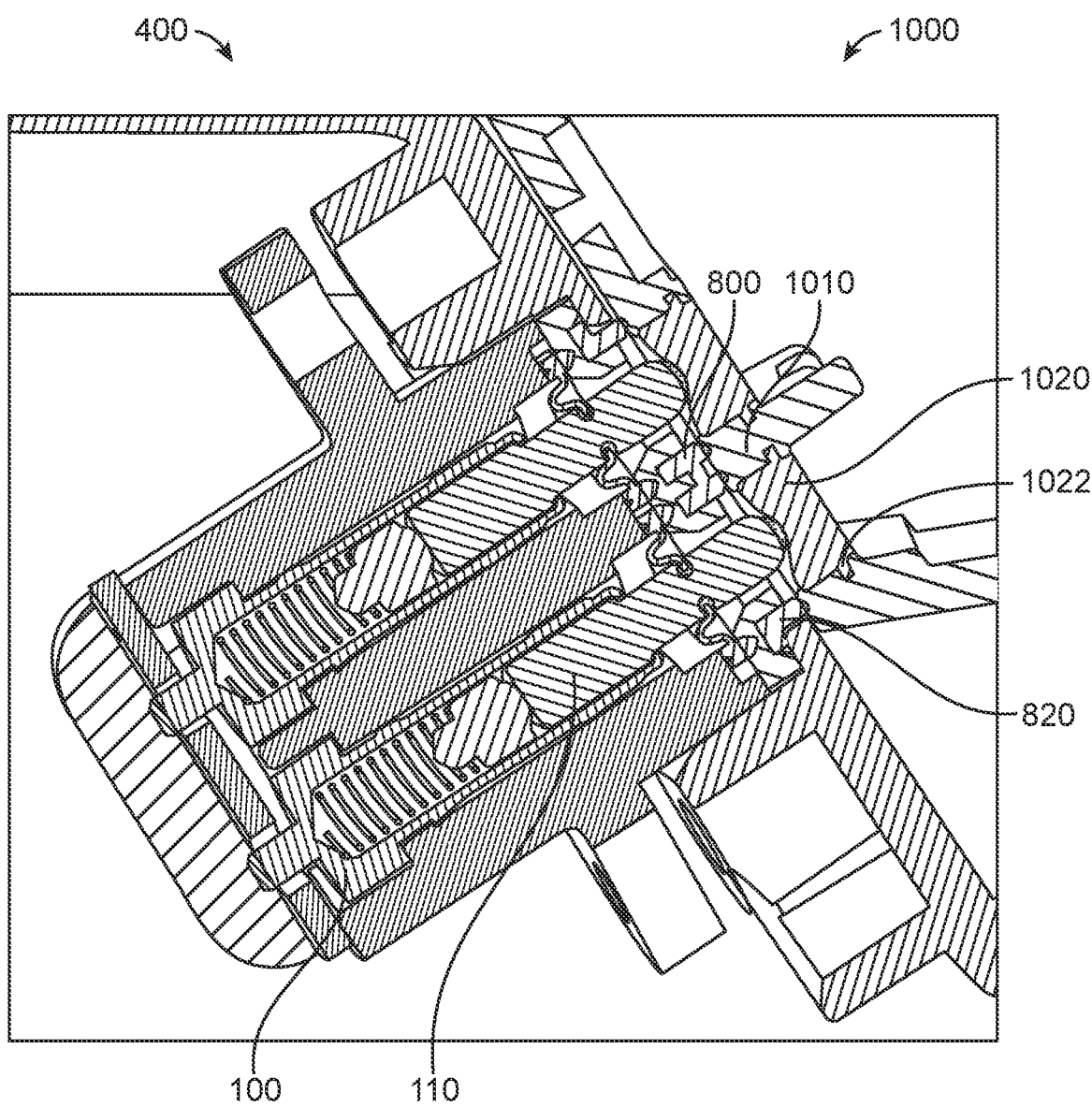
FIG. 10 illustrates a cross-section of a portion of an electronic system according to an embodiment of the present invention.

FIG. 10 illustrates a cross-section of a portion of an electronic system according to an embodiment of the present invention. In this example, accessory device 1000 has been mated with electronic device 400. Accessory device contacts 1020 of accessory device 1000 can physically and electrically connect to plungers 110 of spring-loaded contacts 100. Pliable seal 820 of outer gasket 800 can engage housing 1010 of accessory device 1000 to form seals around a circumference or perimeter of some or all of accessory device contacts 1020. This can help to prevent moisture from bridging between accessory device contacts 1020 on accessory device 1000. Accessory device contacts 1020 can include tabs 1022 that can be molded in housing 1010 of accessory device 1000 to hold accessory device contacts 1020 in place.

Figure 11:
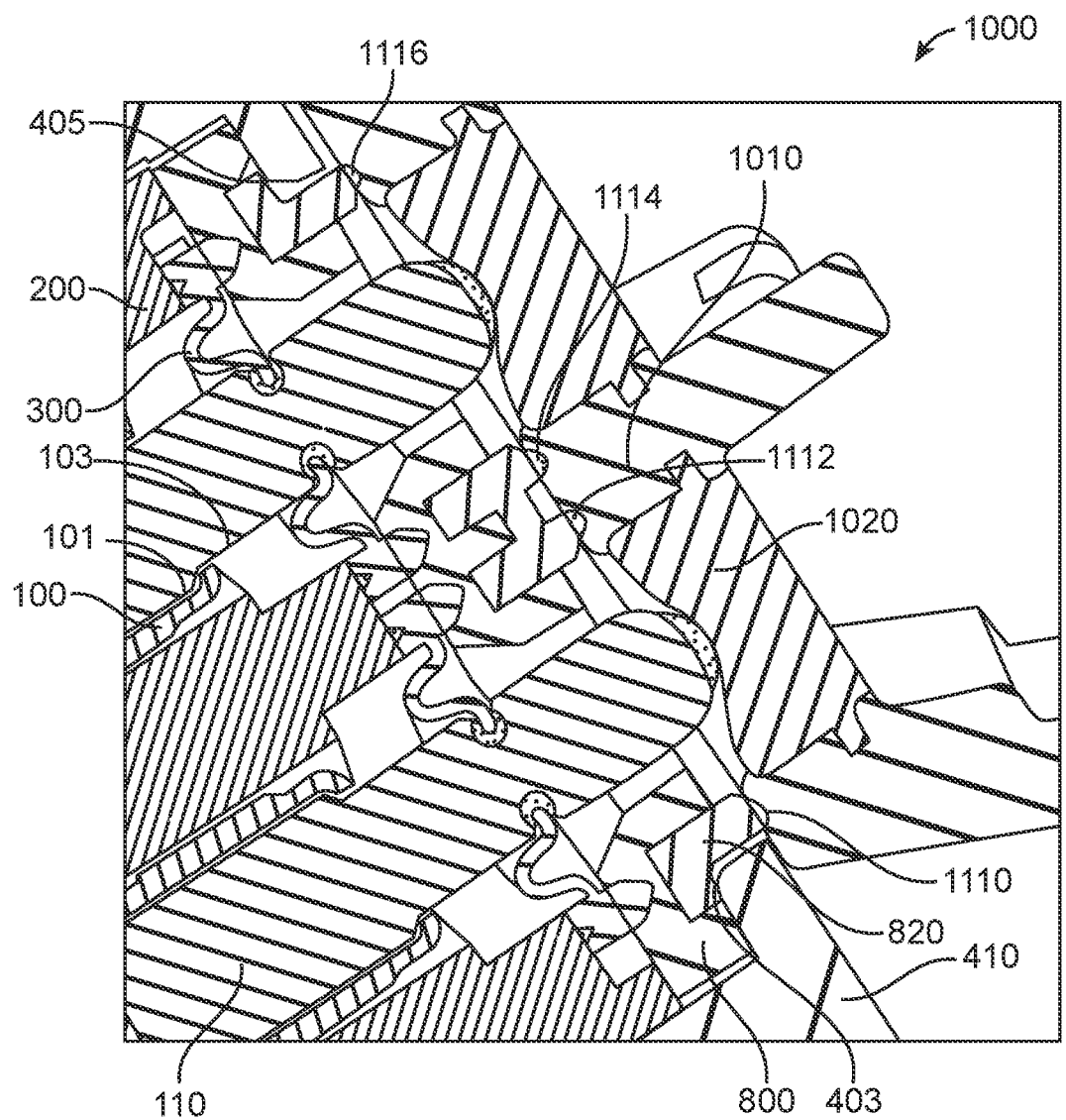
FIG. 11 illustrates a close-up view of a cross-section of a portion of an electronic system according to an embodiment of the present invention.

FIG. 11 illustrates a close-up view of a cross-section of a portion of an electronic system according to an embodiment of the present invention. Again, plungers 110 of spring-loaded contacts 100 can engage accessory device contacts 1020 of accessory device 1000. Pliable seal 820 of outer gasket 800 can form a seal around a circumference or perimeter of each of accessory device contacts 1020. Again, this can prevent moisture from bridging two or more accessory device contacts 1020 on accessory device 1000. Specifically, pliable seal 820 can engage housing 1010 of accessory device 1000 at points 1110, 1112, 1114, and 1116 to form a seal around two accessory device contacts 1020.

With this configuration, inner gaskets 300 can provide a seal between plungers 110 and connector assembly housing 200. This can prevent moisture leakage from entering the spring-loaded contact 100 and connector assembly housing 200. Outer gasket 800 can prevent moisture from bridging between accessory device contacts 1020 on accessory device 1000, as well as plungers 110 of spring-loaded contacts 100. Pliable seal 820 of outer gasket 800 can also form a seal between rigid base 810 and device enclosure 410.

The pliable outer seal can isolate contacts at a surface of the accessory device from each other to prevent moisture bridging. Accordingly, in these and other embodiments of the present invention, various structures and techniques can be used to improve this seal and to further isolate contacts of the accessory device.

For example, the electronic device can be a docking station or charging case designed to hold and charge one, two, three, or more than three accessory devices. The charging case can have a lid that can close when the accessory devices are in place. Retention features can be included on an inside surface of the lid. These retention features can provide a force on the accessory devices pushing them into the pliable seals of the outer gaskets on the electronic device. This force can act to improve the seal and therefore the isolation between contacts of the accessory devices. Examples are shown in the following figures.

FIG. 12 illustrates an electronic system according to an embodiment of the present invention. One or more accessory devices 1000 can be inserted into recesses 430 in electronic device 400. Electronic device 400 can be a docking station or charging case. Accessory devices 1000 can be, or can contain, rechargeable batteries. Electronic device 400 can further include lid 450, which can close over a top surface of base portion 419 of electronic device 400. Lid 450 can be attached to base portion 419 of electronic device 400 at hinge 440. An inside surface 452 of lid 450 can include one or more retention features 1200. Inside surface 452 of lid 450 can include one or more retention features 1200 for each accessory device 1000. Retention features 1200 can be formed of a compressible material. Retention features 1200 can apply a force on accessory devices 1000 pushing them into recesses 430. This force can improve an engagement between accessory device contacts 1020 (shown in FIG. 10) on accessory devices 1000 and plungers 110 (shown in FIG. 10) in electronic device 400. This force can also improve the seal provided by pliable seal 820 of outer gasket 800 (shown FIG. 11.)

Figure 13:
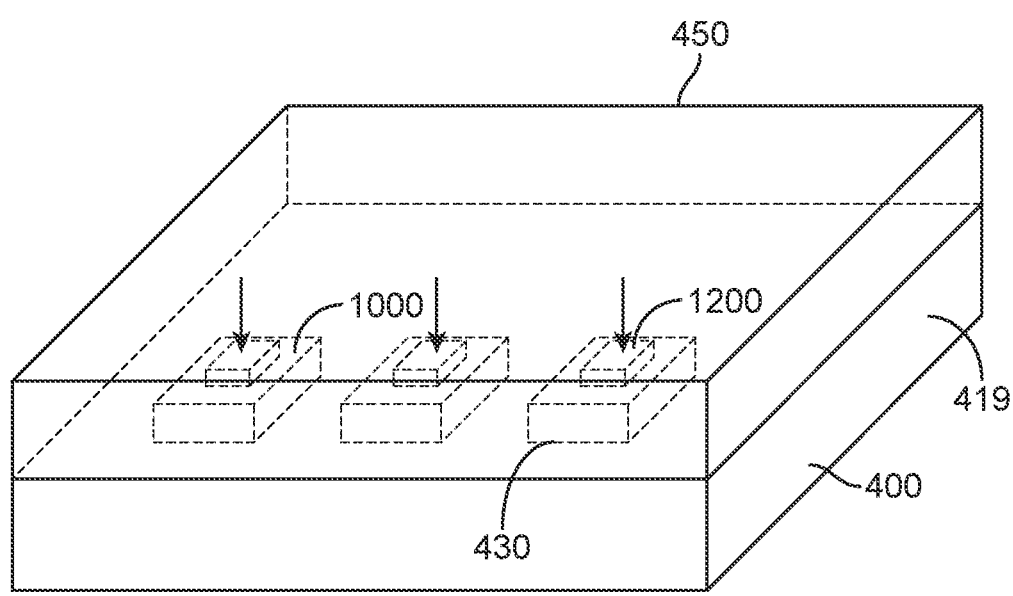
FIG. 13 illustrates the electronic system of FIG. 12 where a lid of an electronic device has been closed.

FIG. 13 illustrates the electronic system of FIG. 12. In this figure, lid 450 has been closed and is shown as transparent. Retention features 1200 can provide a force as shown, thereby pushing accessory devices 1000 into recesses 430 in base portion 419 of electronic device 400.

In these and other embodiments of the present invention, the retention features can be formed as part of the electronic device lid or other housing portion. The retention features can be formed separately from and attached to the electronic device lid or other housing portion. The retention features can be placed under a liner or other layer that holds them in place against the electronic device lid or other housing portion. There can be one or more retention features for each accessory device. One or both of the retention features or electronic device lid can be pliable. The retention features can be substantially hollow pliable structures. They can include one or more ribs or other support structures to assist them in holding their shape. Examples are shown in the following figures.

Figure 14:
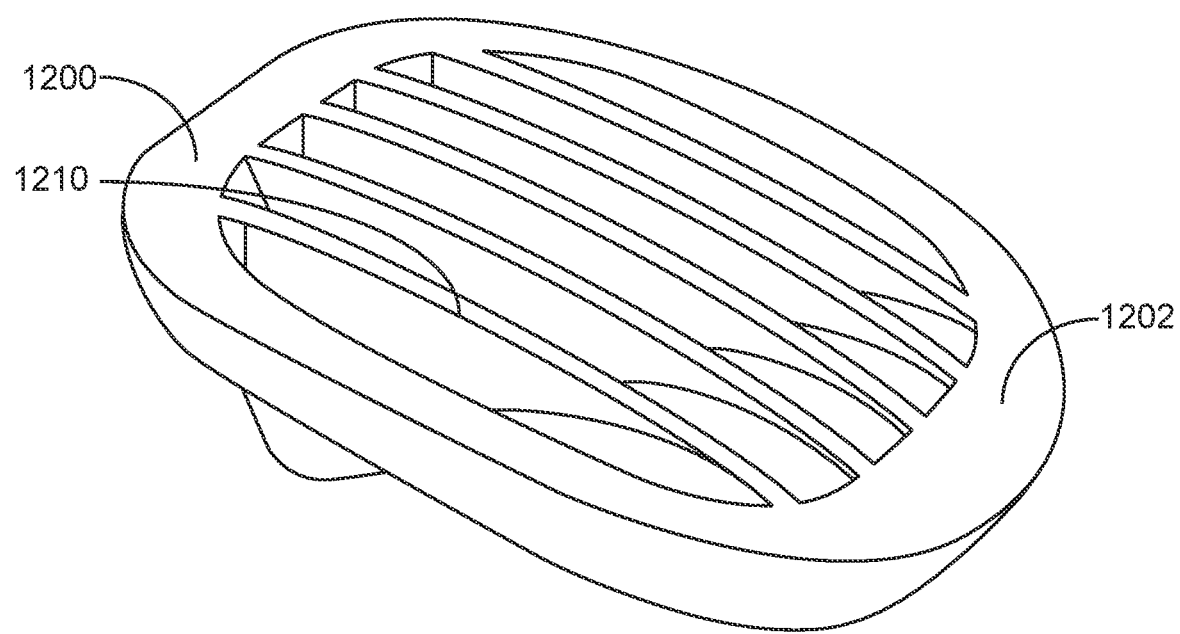
FIG. 14 illustrates a retention feature according to an embodiment of the present invention.

FIG. 14 illustrates a retention feature according to an embodiment of the present invention. Retention feature 1200 can be substantially hollow and can include one or more ribs 1210. Ribs 1210 can help retention feature 1200 to maintain its shape after it is compressed when lid 450 of electronic device 400 is closed, as shown in FIG. 13. Top surface 1202 of retention feature 1200 can be attached to in inside surface 452 of lid 450, as shown in FIG. 12. Retention feature 1200 be formed separately or as part of lid 450. Retention feature 1200 can be held in place by a fabric or other lining on the inside surface 452 of lid 450.

Figure 15:
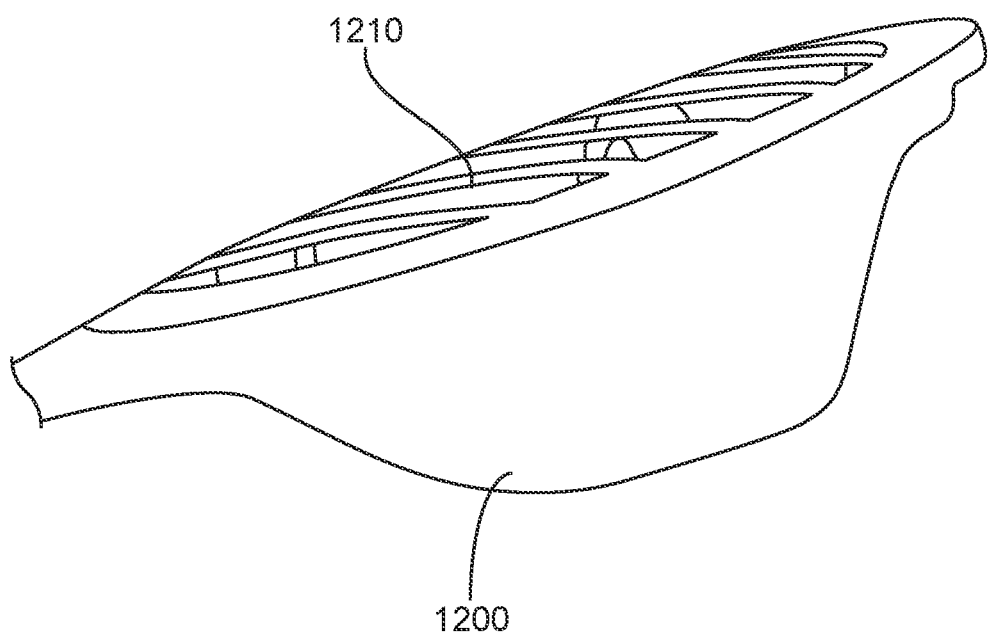
FIG. 15 illustrates a side view of a retention feature according to an embodiment of the present invention.

FIG. 15 illustrates a side view of a retention feature according to an embodiment of the present invention. Again, retention feature 1200 can be substantially hollow and can include one or more ribs 1210, which can provide mechanical support to the retention feature 1200.

In these and other embodiments of the present invention, magnets can be used to improve this seal and to further isolate contacts of the accessory device. To save space in an accessory device, each accessory device can include a limited number of magnets, such as one or two magnets. A corresponding array of magnets can be used in the electronic device to hold the accessory device in place to improve the seal provided by a pliable seal of an outer gasket. For example, an accessory device magnet having a north pole and a south pole can be placed laterally along a side of an accessory device. Three magnets can be arranged in the electronic device. A south pole of a first magnet can be placed proximate to the north pole of the accessory device magnet. A second magnet can be placed such that its south pole is proximate to the north pole of the accessory device magnet and its north pole is proximate to the south pole of the accessory device magnet. A third magnet can be placed such that its north pole is proximate to the south pole of the accessory device magnet. Additional magnets can be used to supplement these magnets. For example, a second accessory device magnet can attract a fourth electronic device magnet, where these additional magnets are arranged to provide a magnetic direction in a direction that is at least substantially orthogonal to the magnetic attraction provided by the above magnets to further secure the accessory device in place in the electronic device. Some or all of these magnets can be rare earth magnets or other types of magnets. Some or all of these magnets may have reversed polarities. Different numbers of magnets may be used in the electronic device and accessory device. Examples of such an arrangement are shown in the following figures.

Figure 16:
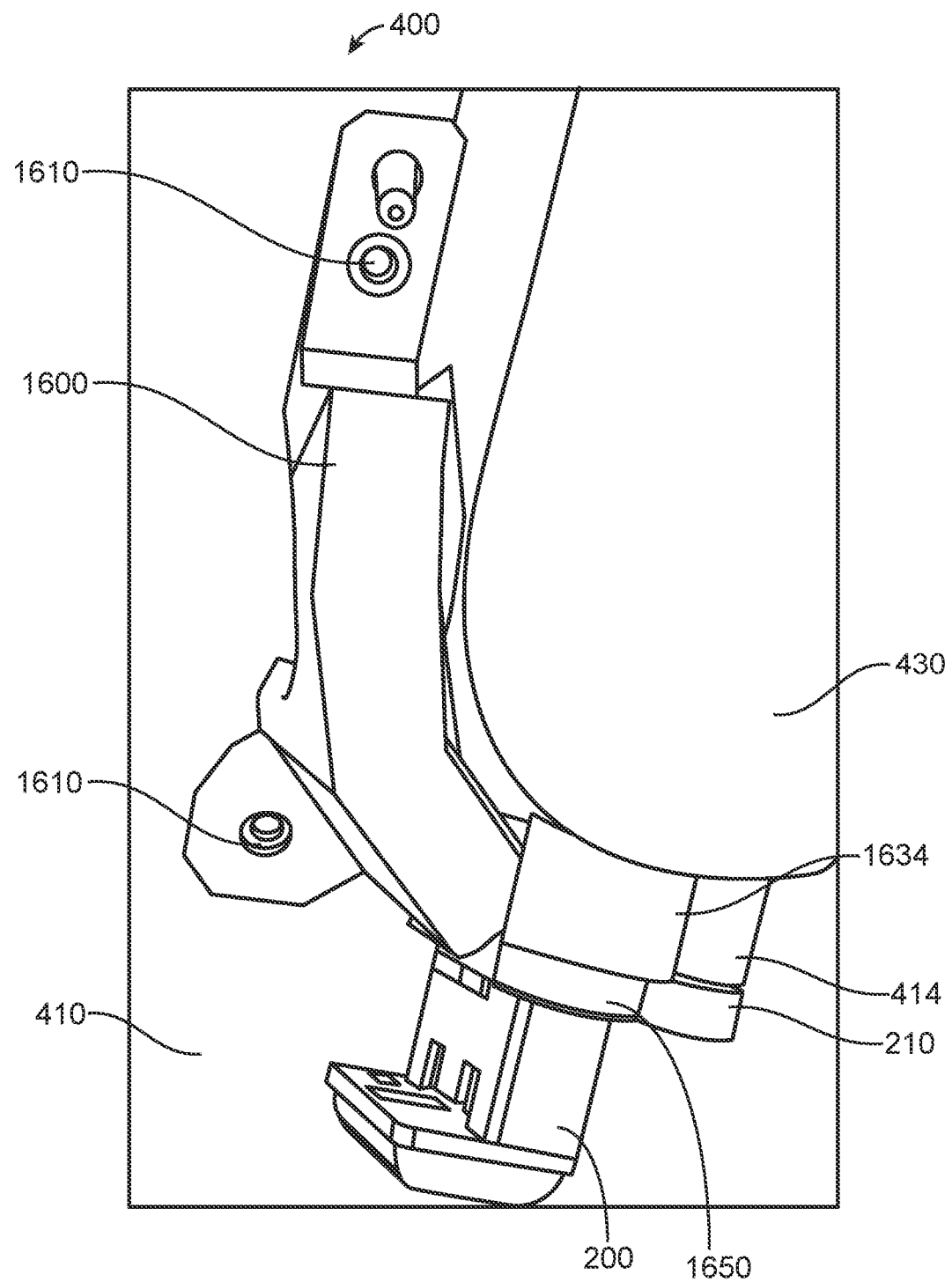
FIG. 16 illustrates an internal portion of an electronic device according to an embodiment of the present invention.

FIG. 16 illustrates an internal portion of an electronic device according to an embodiment of the present invention. This figure illustrates an underside of recess 430 from an internal point in electronic device 400. Cover 1600 can be attached to device enclosure 410 at points 1610 and can retain one or more magnets (shown in FIG. 18.) These one or more magnets can magnetically attract one or more magnets in accessory device 1000 when accessory device 1000 is placed in recess 430. Housing portion 1634 can house an additional magnet 1650, which can also attract one or more magnets in accessory device 1000. Spring-loaded contacts 100 (shown in FIG. 10) can be located in connector assembly housing 200. Plungers of these spring-loaded contacts 100 can engage contacts on accessory device 1000, when accessory device 1000 is placed in recess 430. Connector assembly housing 200 can be attached to device enclosure 410 by using fasteners passed through openings in holes in flanges 210 and tabs 414, as shown in FIG. 9.

Figure 17:
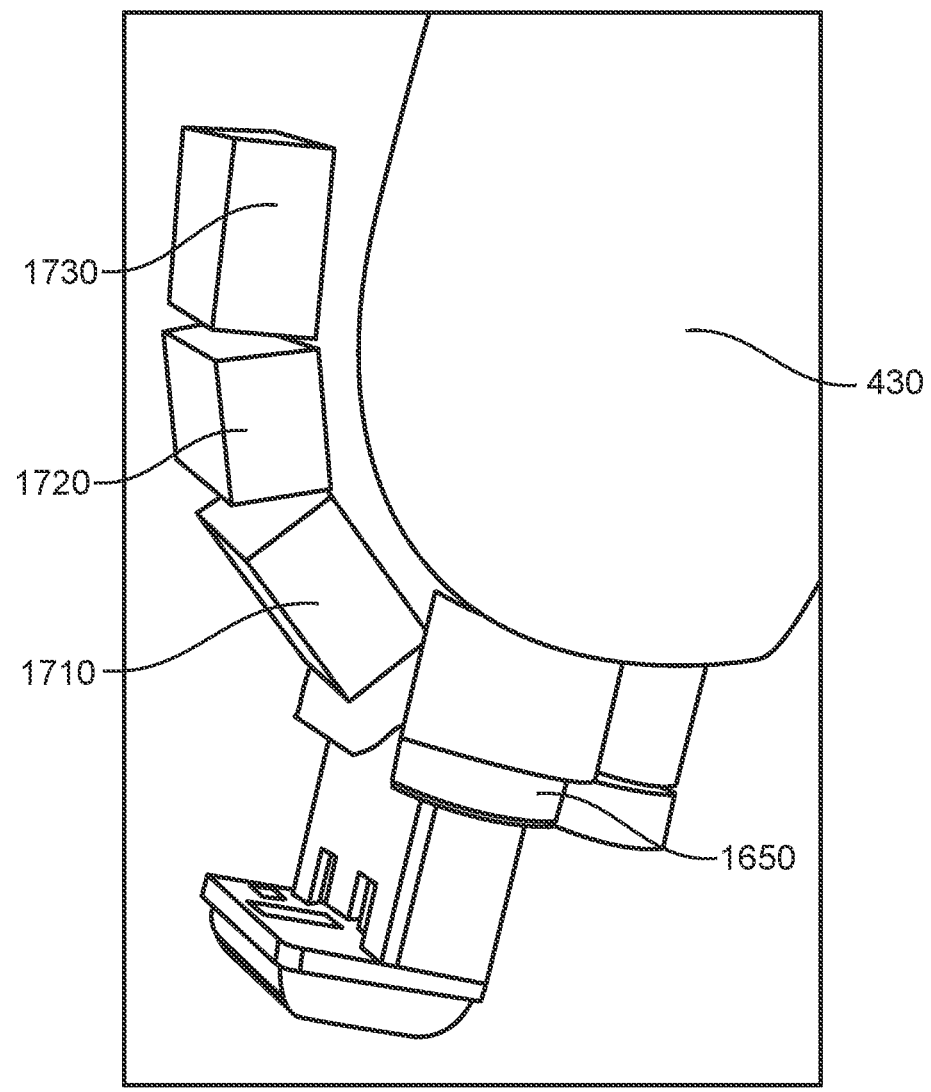
FIG. 17 illustrates the internal portion of an electronic device as shown in FIG. 16, where a cover for magnets has been removed.

FIG. 17 illustrates the internal portion of an electronic device as shown in FIG. 16, where a cover for magnets has been removed. Specifically, cover 1600 has been removed thereby exposing a plurality of magnets including magnet 1710, magnet 1720, and magnet 1730. Magnet 1710, magnet 1720, and magnet 1730 can attract one or more magnets in an accessory device 1000 (shown in FIG. 10), when accessory device 1000 is inserted in recess 430. Magnet 1650 can also attract one or more magnets in accessory device 1000. The magnetic attraction provided by magnet 1650, magnet 1710, magnet 1720, and magnet 1730, can improve the seal provided by pliable seal 820 (shown in FIG. 8.)

Figure 18:
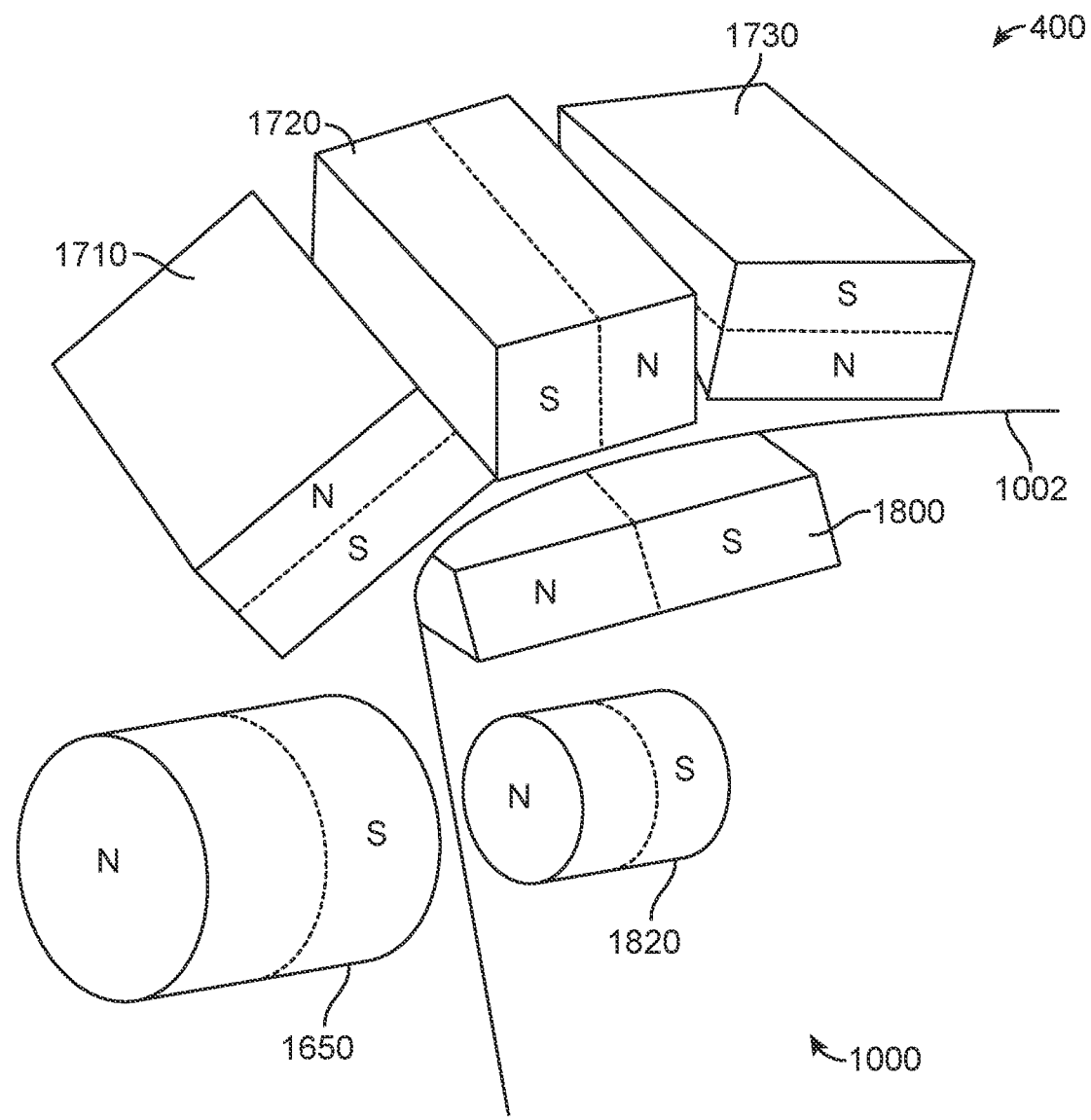
FIG. 18 illustrates an array of magnets that can be employed in an electronic system according to an embodiment of the present invention.

FIG. 18 illustrates a plurality of magnets that can be employed in an electronic system according to an embodiment of the present invention. This figure illustrates magnet 1710, magnet 1720, magnet 1730, and magnet 1650 from FIG. 17, which can be located in electronic device 400. Accessory device 1000 can include magnets 1800 and 1820. Magnet 1800 can be placed laterally along a side 1002 of accessory device 1000. A south pole of magnet 1650 can attract a north pole of magnet 1820. A south pole of magnet 1710 can be proximately located to a north pole of magnet 1800. A south pole of magnet 1720 can also be proximately located to a north pole of magnet 1800. The south poles of magnets 1710 and 1720 can attract the north pole of magnet 1800. A north pole of magnet 1720 can be proximately located to a south pole of magnet 1800. Also, a north pole of magnet 1730 can be proximately located with the south pole of magnet 1800. In this way, the north poles of magnet 1720 and magnet 1730 can attract the south pole of magnet 1800. Again, this can help to retain accessory device 1000 in recess 430. This can help to improve a seal provided by pliable seal 820 around accessory device contacts 1020 on accessory device 1000. Magnet 1800 can attract magnet 1710, magnet 1720, and magnet 1730 in a first direction while magnet 1820 can attract magnet 1650 in a second direction, where the first direction and the second direction are at least substantially orthogonal to each other. In these and other embodiments of the present invention, some of all of these magnets can be reversed in polarity. Also, in these and other embodiments of the present invention, other numbers of magnets may be used in either or both electronic device 400 and accessory device 1000.

In these and other embodiments of the present invention, an additional inner gasket or O-ring (not shown) can be located between the barrel of a spring-loaded contact and the connector assembly housing. Also, other structures, such as barbs 122 and 124 on barrels 120 of spring-loaded contacts 100, can be include to protect these leakage paths and help to reduce the amount of ingress of liquids or other substances into the spring-loaded contacts and electronic device.

In these and other embodiments of the present invention, a connector assembly housing 200 may support one, two, three, or more than three spring-loaded contacts 100. Each spring loaded contact 100 may correspond to an individual inner gasket 300, or more than one spring loaded contact 100 may share an inner gasket 300. Such a shared inner gasket

300 may include multiple openings 322, one for each plunger 110 on a spring-loaded contact 100. Each connector assembly housing 200 may correspond to one or more than one such individual or shared inner gasket 300, or combination thereof. Also, each spring-loaded contact 100 may have an individual outer gasket 800, or more than one spring loaded contact 100 may share an outer gasket 800. Such a shared outer gasket 800 may include multiple openings 802, one for each plunger 110 on a spring-loaded contact 100. Each connector assembly housing 200 may correspond to one or more than one such individual or shared outer gasket 800, or combination thereof.

In these and other embodiments of the present invention, connector assemblies can be kept small by only using two spring-loaded contacts 100. The two spring-loaded contacts 100 can be used to convey power and ground. They can also be used to convey data, or data can be wirelessly transmitted and received by the electronic device (not shown.)

Embodiments of the present invention can provide connector assemblies that can be located in various types of devices, such as portable computing devices, tablet computers, desktop computers, laptops, all-in-one computers, wearable computing devices, cell phones, smart phones, media phones, storage devices, keyboards, covers, charging cases, portable media players, navigation systems, monitors, power supplies, adapters, audio devices and equipment, remote control devices, chargers, and other devices. These connector assemblies can provide pathways for signals and power compliant with various standards such as one of the Universal Serial Bus standards including USB Type-C, High-Definition Multimedia Interface, Digital Visual Interface, Ethernet, DisplayPort, Thunderbolt, Lightning, Joint Test Action Group, test-access-port, Directed Automated Random Testing, universal asynchronous receiver/transmitters, clock signals, power signals, and other types of standard, non-standard, and proprietary interfaces and combinations thereof that have been developed, are being developed, or will be developed in the future. In one example, the connector assemblies can be used to convey a data signal, a power supply, and ground. In various embodiments of the present invention, the data signal can be unidirectional or bidirectional and the power supply can be unidirectional or bidirectional. In these and other embodiments of the present invention, the connector assemblies can be used to convey power and ground, while data is transmitted wirelessly.

The above description of embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. Thus, it will be appreciated that the invention is intended to cover all modifications and equivalents within the scope of the following claims.

What is claimed is:

1. A connector assembly comprising:
    a connector assembly housing having a first passage and a second passage;
    a first spring-loaded contact in the first passage;
    a second spring-loaded contact in the second passage, wherein each of the first spring-loaded contact and the second spring-loaded contact comprises:
        a barrel having a bottom surface at a first end and a front opening at a second end;
        a plunger in the barrel and having a contacting portion extending from the front opening of the barrel and a top surface of the connector assembly housing; and
        a spring between the bottom surface of the barrel and a back surface of the plunger; and
    a first inner gasket around the plunger of the first spring-loaded contact; and
    a second inner gasket around the plunger of the second spring-loaded contact, wherein each of the first inner gasket and the second inner gasket comprises:
        an outer ring located on the top surface of the connector assembly housing; and
        an inner ring around the plunger of a corresponding spring-loaded contact.

2. The connector assembly of claim 1 wherein each of the first inner gasket and the second inner gasket further comprises a bellows between the outer ring and the inner ring.

3. The connector assembly of claim 2 wherein the first inner gasket and the second inner gasket further comprise a recessed portion between the outer ring and the inner ring.

4. The connector assembly of claim 2 wherein the plunger for each of the first spring-loaded contact and the second spring-loaded contact comprises a circumferential groove to accept the inner ring of the corresponding inner gasket.

5. The connector assembly of claim 2 further comprising an outer gasket comprising a rigid base and a pliable seal, wherein the first inner gasket and the second inner gasket are between the connector assembly housing and the rigid base.

6. The connector assembly of claim 5 wherein the pliable seal is against a housing of an accessory when the accessory and an electronic device housing the connector assembly are mated.

7. An electronic device comprising:
    a device enclosure at least partially housing the electronic device;
    a connector assembly housing located in the device enclosure and having a first passage and a second passage;
    a first spring-loaded contact in the first passage;
    a second spring-loaded contact in the second passage, wherein each of the first spring-loaded contact and the second spring-loaded contact comprises:
        a barrel having a bottom surface at a first end and a front opening at a second end;
        a plunger in the barrel and having a contacting portion extending from the front opening of the barrel, a top surface of the connector assembly housing, and a surface of the device enclosure; and
        a spring between the bottom surface of the barrel and a back surface of the plunger; and
    a first inner gasket around the plunger of the first spring-loaded contact;
    a second inner gasket around the plunger of the second spring-loaded contact; and
    an outer gasket comprising a rigid base and a pliable seal, wherein the first inner gasket and the second inner gasket are between the connector assembly housing and the rigid base.

8. The electronic device of claim 7 wherein each of the first inner gasket and the second inner gasket comprises:
    an outer ring located on the top surface of the connector assembly housing; and
    an inner ring around the plunger of a corresponding spring-loaded contact.

9. The electronic device of claim 8 wherein each of the first inner gasket and the second inner gasket further comprises a bellows between the outer ring and the inner ring.

10. The electronic device of claim 8 wherein the first inner gasket and the second inner gasket further comprise a recessed portion between the outer ring and the inner ring.

11. The electronic device of claim 8 wherein the plunger for each of the first spring-loaded contact and the second spring-loaded contact comprises a circumferential groove to accept the inner ring of the corresponding inner gasket.

12. The electronic device of claim 8 wherein the first inner gasket and the second inner gasket are between the connector assembly housing and the rigid base.

13. The electronic device of claim 12 wherein the pliable seal is against a housing of an accessory when the accessory and the electronic device are mated.

14. An electronic system comprising:
an accessory having a first side and a first magnet having a north pole and a south pole laterally positioned along the first side; and
an electronic device comprising a first plurality of magnets, the first plurality of magnets comprising:
a first magnet having a south pole proximately located to the north pole of the first magnet in the accessory when the accessory and the electronic device are mated;
a second magnet having a south pole proximately located to the north pole of the first magnet in the accessory and a north pole proximately located to the south pole of the first magnet in the accessory when the accessory and the electronic device are mated; and
a third magnet having north pole proximately located to the south pole of the first magnet in the accessory when the accessory and the electronic device are mated.

15. The electronic system of claim 14 wherein the accessory further comprises a second magnet having a north pole near a side of the accessory and the electronic device further comprises a fourth magnet having south pole proximately located to the north pole of the second magnet in the accessory.

16. The electronic system of claim 14 wherein the electronic device further comprises a case having a base portion and a lid, wherein the base portion includes a recess to accept the accessory, and the lid comprises a retention feature to provide a force pushing the accessory into the recess when the lid is closed.

17. The electronic device of claim 16 wherein the retention feature is substantially hollow and has a plurality of support ribs.

18. The electronic system of claim 14 wherein the electronic device further comprises:
a connector assembly housing having a first passage and a second passage;
a first spring-loaded contact in the first passage;
a second spring-loaded contact in the second passage, wherein each of the first spring-loaded contact and the second spring-loaded contact comprises:
a barrel having a bottom surface at a first end and a front opening at a second end;
a plunger in the barrel and having a contacting portion extending from the front opening of the barrel and a top surface of the connector assembly housing; and
a spring between the bottom surface of the barrel and a back surface of the plunger; and
a first inner gasket around the plunger of the first spring-loaded contact; and
a second inner gasket around the plunger of the second spring-loaded contact.

19. The electronic system of claim 18 further comprising an outer gasket comprising a rigid base and a pliable seal, the rigid base against the first inner gasket and the second inner gasket.

20. The electronic system of claim 19 wherein the pliable seal is against a housing of the accessory when the accessory and the electronic device are mated.

* * * * *